United States Patent
Maki et al.

(10) Patent No.: US 8,658,009 B2
(45) Date of Patent: Feb. 25, 2014

(54) THIN FILM TRANSISTOR HAVING A BARRIER LAYER AS A CONSTITUTING LAYER AND CU-ALLOY SPUTTERING TARGET USED FOR SPUTTER FILM FORMATION OF THE BARRIER LAYER

(75) Inventors: Kazunari Maki, Saitama (JP); Kenichi Yaguchi, Ageo (JP); Yosuke Nakasato, Osaka (JP); Satoru Mori, Okegawa (JP)

(73) Assignees: Mitsubishi Materials Corporation, Tokyo (JP); Ulvac, Inc., Chigasaki-shi (JP)

( * ) Notice: Subject to any disclaimer, the term of this patent is extended or adjusted under 35 U.S.C. 154(b) by 65 days.

(21) Appl. No.: 13/138,159

(22) PCT Filed: Oct. 22, 2009

(86) PCT No.: PCT/JP2009/005576
§ 371 (c)(1),
(2), (4) Date: Jul. 14, 2011

(87) PCT Pub. No.: WO2010/103587
PCT Pub. Date: Sep. 16, 2010

(65) Prior Publication Data
US 2011/0309444 A1    Dec. 22, 2011

(30) Foreign Application Priority Data
Mar. 11, 2009 (JP) .................. 2009-057359

(51) Int. Cl.
*C23C 14/34* (2006.01)
(52) U.S. Cl.
USPC .............. 204/298.13; 204/298.12; 420/469; 420/489; 420/494
(58) Field of Classification Search
USPC ......... 204/298.12, 298.13; 420/469, 489, 494
See application file for complete search history.

(56) References Cited

U.S. PATENT DOCUMENTS

2007/0039817 A1 * 2/2007 Daniels et al. ........... 204/298.12

FOREIGN PATENT DOCUMENTS

| CN | 1771547 A | 5/2006 |
|---|---|---|
| JP | 04-349637 A | 12/1992 |
| JP | 2005-166757 A | 6/2005 |
| JP | 2008-191541 A | 8/2008 |
| JP | 2008-205420 A | 9/2008 |
| JP | 2009-043797 A | 2/2009 |
| JP | 2009-070881 A | 4/2009 |
| KR | 10-2008-0086997 A | 9/2008 |
| KR | 10-2009-0068241 A | 6/2009 |

OTHER PUBLICATIONS

International Search Report dated Nov. 24, 2009, issued for PCT/JP2009/005576.

(Continued)

*Primary Examiner* — Rodney McDonald
(74) *Attorney, Agent, or Firm* — Edwards Wildman Palmer LLP

(57) ABSTRACT

This Cu alloy sputtering target includes, in terms of atomic percent: Al: 1% to 10%; and Ca: 0.1% to 2%, with the balance being Cu and 1% or less of inevitable impurities. This thin film transistor includes: a gate electrode layer joined to the surface of a glass substrate through an adhesion layer; a gate insulating layer; a Si semiconductor layer; an n-type Si semiconductor layer; a barrier layer; a wire layer composed of a drain electrode layer and a source electrode layer, both of which are mutually divided; a passivation layer; and a transparent electrode layer, wherein the barrier layer is formed by sputtering under an oxidizing atmosphere using the Cu alloy sputtering target.

1 Claim, 1 Drawing Sheet

(56) References Cited

OTHER PUBLICATIONS

Notice of Allowance mailed Feb. 26, 2013, issued for the Korean patent application No. 10-2011-7017282 and English translation thereof.

Office Action mailed Mar. 28, 2013, issued for the Chinese patent application No. 200980157928.8 and partial translation of the Search Report.

* cited by examiner

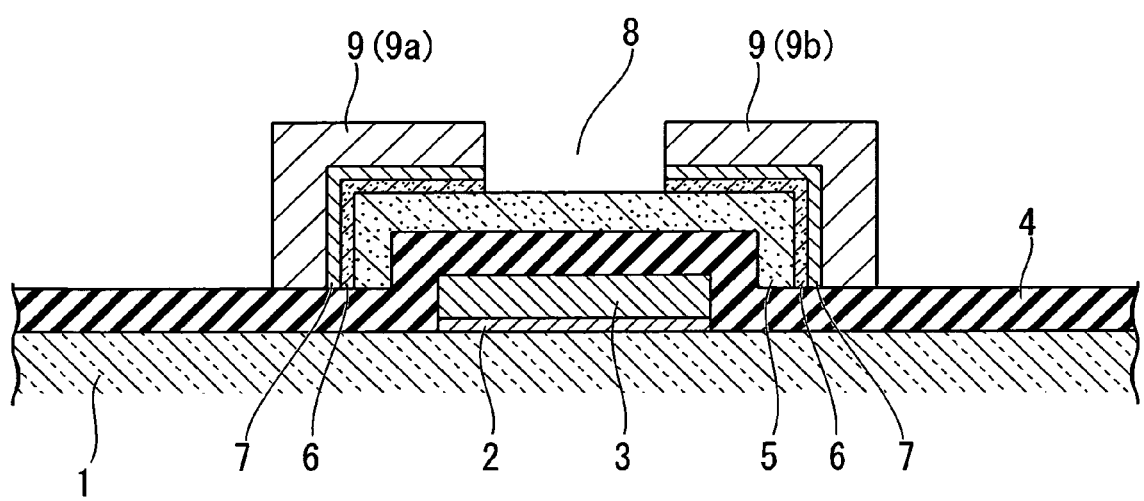

THIN FILM TRANSISTOR HAVING A BARRIER LAYER AS A CONSTITUTING LAYER AND CU-ALLOY SPUTTERING TARGET USED FOR SPUTTER FILM FORMATION OF THE BARRIER LAYER

TECHNICAL FIELD

The present invention relates to a thin film transistor used for various types of displays, and specifically the present invention relates to a barrier layer located between a wire layer of pure copper (a drain electrode layer and a source electrode layer) and an n-type Si semiconductor layer that are constituting layers of the thin film transistor, and a Cu alloy sputtering target used for forming the barrier layer. In detail, the present invention relates to a barrier layer, and a Cu alloy sputtering target used for forming the barrier layer, and the barrier layer has a high adhesion strength to the wire layer as well as the n-type Si semiconductor layer, and the barrier layer also has a function (hereinafter referred to as 'barrier function') of sufficiently preventing the mutual diffusion of Si and Cu that are constituting components of the upper side layer and the lower side layer.

The present application claims priority on Japanese Patent Application No. 2009-057359 filed Mar. 11, 2009, the content of which is incorporated herein by reference.

BACKGROUND ART

As flat-panel displays in which thin-film transistors driven by an active matrix method are used, a liquid crystal display, a plasma display, an organic EL display, an inorganic EL display, and the like are known. In these flat panel displays in which the thin-film transistors are used, wires made of a metallic layer are formed to adhere to the surface of a glass substrate in a grid pattern, and thin film transistors are provided at the intersections of the grid-pattern wires made of the metallic layer.

As exemplified in a schematic vertical cross-sectional view of main portions in FIG. 1, it is well known that the thin film transistor has a laminate structure which includes a gate electrode layer 3 of pure copper joined through an adhesion layer 2 of metallic Mo, a gate insulating layer 4 of silicon nitride, an Si semiconductor layer 5, n-type Si semiconductor layers 6, barrier layers which are formed by sputtering in an oxidizing atmosphere using a Cu alloy target, a wire layer 9 composed of a pure copper drain electrode layer 9a and a source electrode layer 9b which are partitioned by an isolation trench 8, a passivation layer of silicon nitride, and a transparent electrode layer. The layers are laminated in series on the surface of a glass substrate 1, and the passivation layer and the transparent electrode layer are not shown in FIG. 1.

In a process of manufacturing a thin film transistor having such a laminate structure, the isolation trench 8 is formed in the wire layer 9 by a wet etching treatment so as to divide the wire layer 9 into the drain electrode layer 9a and the source electrode layer 9b. Then, a portion of the n-type Si semiconductor layer which is exposed at the bottom of the diffusion groove (isolation trench 8) formed in the wire layer 9 is removed by a dry etching treatment.

In the portion of the Si semiconductor layer 5 exposed at the bottom of the isolation trench 8 after the wet etching treatment and the dry etching treatment, hydrogen atoms are removed from the surface by the dry etching treatment. Thereby, the surface becomes extremely unstable, that is, the number of dangling bonds increases, and these dangling bonds become surface defects. The surface defects increase an off-state current of the thin film transistor. As a result, an unstable state is formed in which problems such as a decrease in the contrast of an LCD, a reduction in a viewing angle, and the like cannot be avoided. Therefore, hydrogen plasma processing is performed on the exposed surface of the Si semiconductor layer 5 under the conditions where 100% of hydrogen gas is used, a hydrogen gas flow rate is in a range of 10 to 1000 SCCM, a hydrogen gas pressure is in a range of 10 to 500 Pa, a processing temperature is in a range of 200 to 250° C., an output is in a range of 0.005 to 0.5 W/cm$^2$, and a processing time is in a range of 0.5 to 1 minute. Thereby, the dangling bonds of the surface of the Si semiconductor layer 5 are bound to hydrogen atoms to stabilize the surface thereof.

In addition, it is also known that the barrier layers which are constituting layers of the thin film transistor are formed by the following method: a film is formed by sputtering with a Cu alloy sputtering target having a component composition which includes, in terms of atomic % (hereinafter '%' indicates 'atomic %'), one or more of Mg, Ti, Al, and Cr: 0.5% to 20% with the balance being Cu and inevitable impurities (1% or less); and then the film is subjected to a heating oxidation treatment in an oxidizing atmosphere (air).

Meanwhile, large-sized screens and high integration of various types of flat-panel displays have been developed remarkably in recent years, and with this development, much higher adhesion strength tends to be required between each of the laminated films included in the thin-film transistor.

In the above-mentioned conventional thin-film transistor, high adhesion strengths capable of sufficiently satisfying the above-mentioned requirement are secured between the glass substrate 1 and the gate electrode layer 3 of pure copper, between the gate electrode layer 3 and the gate insulating layer 4 of silicon nitride, between the gate insulating layer 4 and the Si semiconductor layer 5, between the Si semiconductor layer 5 and the n-type Si semiconductor layers 6, between the barrier layers and the wire layer 9 of pure copper, between the wire layer 9 of pure copper and the passivation layer of silicon nitride, and between the passivation layer and the transparent electrode layer. The passivation layer and the transparent electrode layer are not shown. However, the adhesion strength between the barrier layer and the n-type Si semiconductor layer 6 is relatively low, and the adhesive strength therebetween is not high enough to satisfy the above-mentioned requirement.

PRIOR ART DOCUMENTS

Patent Documents

Patent Document 1: Japanese Unexamined Patent Application, Publication No. H04-349637
Patent Document 2: Japanese Unexamined Patent Application, Publication No. 2005-166757

DISCLOSURE OF THE INVENTION

Problems to be Solved by the Invention

The present invention aims to provide a thin film transistor including barrier layers which have high adhesion strengths between the barrier layers and the n-type Si semiconductor layers, and a Cu alloy sputtering target that can form the barrier layers.

Means for Solving the Problems

From the above-mentioned viewpoint, the inventors have performed researches for the purpose of securing high adhesion strength between the barrier layer and the n-type Si semiconductor layer in the above-mentioned conventional thin film transistor. As a result, the following research results were obtained.

(a) The barrier layer is a constituting layer of a thin film transistor, and the adhesion strength of the barrier layer to the n-type Si semiconductor layer is lowered as the screen size and integration of flat panel displays are increased. One of the reasons thereof is the fact that, particularly, the conditions of the above-mentioned hydrogen plasma treatment require a higher temperature and a longer time period. For example, the hydrogen plasma treatment needs to be conducted under conditions including higher temperatures and longer time periods, such as conditions where 100% of hydrogen gas is used, a hydrogen gas flow rate is in a range of 10 to 1000 SCCM, a hydrogen gas pressure is in a range of 10 to 500 Pa, an output is in a range of 0.005 to 0.5 W/cm$^2$, a processing temperature is in a range of 250 to 350° C., and a processing time is in a range of 1 minute to 5 minutes. As a result, among the constituting components of the barrier layer, particularly, oxygen is activated and diffuses toward the wire layer and the n-type Si semiconductor layer; and thereby, the fractional content of oxygen in the barrier layer is lowered (lack of oxygen). This is considered as a cause of the lowering of the adhesion strength.

(b) Among the alloy components of the conventional Cu alloy sputtering target which is used for forming the conventional barrier layer, the inventors focused on Al. Studies were carried out using Cu alloy sputtering targets containing Ca as an alloy component at amounts in a range of 0.1% to 2% together with Al.

In detail, barrier films were formed by sputtering in an oxidization atmosphere with a Cu alloy sputtering target having a component composition which included Al: 1% to 10% and Ca: 0.1% to 2% with the balance being Cu and 1% or less of inevitable impurities, and then properties of the films were evaluated. As a result, it could be confirmed that, even after a hydrogen plasma treatment performed under the conditions of high temperatures and long time periods involved in the increase in the screen size and integration of flat panel displays, it is possible to form a barrier layer of which the adhesion strengths are maintained at high values between the barrier layer and the wire layer, and between the barrier layer and the n-type Si semiconductor layer, and an excellent barrier function of the barrier layer can also be maintained.

The reason is considered to be that the diffusion of oxygen toward the wire layer and the n-type Si semiconductor layer is remarkably suppressed by the action of Ca which is an alloy component.

The present invention has been made based on the above-described research results and has the following features.

The thin film transistor of the present invention has a high adhesion strength between a barrier layer and an n-type Si semiconductor layer, and includes: a gate electrode layer joined to a surface of a glass substrate through an adhesion layer; a gate insulating layer; a Si semiconductor layer; an n-type Si semiconductor layer; a barrier layer; a wire layer composed of a drain electrode layer and a source electrode layer, both of which are mutually divided; a passivation layer; and a transparent electrode layer. The layers are laminated in series on the glass substrate. The barrier layer is formed by sputtering under an oxidizing atmosphere using a Cu alloy sputtering target having a component composition which includes, in terms of atomic percent: Al: 1% to 10%; and Ca: 0.1% to 2%, with the balance being Cu and 1% or less of inevitable impurities.

The Cu alloy sputtering target of the present invention used for sputter film formation of a barrier layer is used to form a barrier layer constituting a thin film transistor by sputtering under an oxidizing atmosphere. The Cu alloy sputtering target is composed of a Cu alloy which includes, in terms of atomic percent: Al: 1% to 10%; and Ca: 0.1% to 2%, with the balance being Cu and 1% or less of inevitable impurities.

Effects of the Invention

In the thin film transistor of the present invention, the barrier layer located between an upper layer which is the wire layer of pure copper and a lower layer which is the n-type Si semiconductor layer is formed by sputtering under an oxidizing atmosphere using a Cu alloy sputtering target having the component composition including Al: 1% to 10% and Ca: 0.1% to 2% with the balance being Cu and 1% or less of inevitable impurities.

Not only adhesiveness to the upper layer which is the wire layer but also adhesiveness to the lower layer which is the n-type Si semiconductor layer are excellent, and the excellent adhesiveness is maintained even after a hydrogen plasma treatment performed under the conditions of high temperatures and long time periods during the manufacturing process of the thin film transistor. Furthermore, an excellent barrier function can also be provided. Therefore, the thin film transistor of the present invention can have satisfactory properties to meet the requirements in compliance with the increase in the screen size and integration of flat panel displays.

The Cu alloy sputtering target of the present invention can form the above-described barrier film of the thin film transistor.

BRIEF DESCRIPTION OF THE DRAWINGS

FIG. 1 is a schematic vertical cross-sectional view illustrating main portions of a thin-film transistor.

BEST MODE FOR CARRYING OUT THE INVENTION (Cu Alloy Sputtering Target)

Next, the reasons why the component composition of the Cu alloy sputtering target of the present invention are limited as described above will be explained.

(a) Al

Al component has an effect of securing strong adhesiveness between a barrier layer and an upper layer which is a wire layer and between the barrier layer and a lower layer which is an n-type Si semiconductor layer. In addition, Al has an effect of providing the barrier layer to be formed with an excellent barrier function. However, in the case where the Al content is less than 1%, a desired improvement in the above-described effects cannot be obtained. On the other hand, in the case where the Al content exceeds 10%, there is a tendency that conductivity thereof decreases. Therefore, the Al content is limited to be in a range of 1% to 10%, and preferably in a range of 2% to 8%.

(b) Ca

Ca component has an effect of stabilizing the barrier layer formed by sputtering in an oxidizing atmosphere as described above; and thereby, a reduction of adhesiveness is prevented even in the case where conditions of the hydrogen plasma treatment include higher temperatures and longer time periods.

During the hydrogen plasma treatment, there were cases where oxygen that is a constituting component diffused toward the upper layer which is the wire layer of pure copper and the lower layer which is the n-type Si semiconductor layer so that the fractional content of oxygen in the barrier layer was reduced, that is, the layer lacked oxygen. Particularly, the Ca component has an effect of suppressing the diffusion of oxygen; and thereby, the lack of oxygen in the barrier layer is prevented. It is considered that the reduction of the adhesiveness is suppressed due to the above-described effect.

In the case where the Ca content is less than 0.1%, a desired improvement in the above-described effects cannot be obtained. On the other hand, even in the case where the Ca content exceeds 2%, a further improvement in the effects cannot be obtained. Therefore, the Ca content is limited to be in a range of 0.1% to 2%.

(c) Balance: Cu and Inevitable Impurities

In the case where the content of inevitable impurities in the target exceeds, the content of the inevitable impurities in the barrier layer formed by sputtering with the target also becomes a value in a range of more than 1%. In this case, there is a tendency that the adhesiveness decreases. Therefore, the content of the inevitable impurities needs to be in a range of 1% or less.

(Thin Film Transistor)

FIG. 1 shows a vertical cross-sectional view of a thin-film transistor according to the present invention.

The thin film transistor of the present invention includes: a gate electrode layer 3 joined to the surface of the glass substrate 1 through an adhesion layer 2; a gate insulating layer 4; a Si semiconductor layer 5; n-type Si semiconductor layers 6; barrier layers 7; a wire layer 9 composed of a drain electrode layer 9a and a source electrode layer 9b, both of which are mutually divided; a passivation layer; and a transparent electrode layer. The layers are laminated on the glass substrate 1 in series in the above-described order.

The barrier layers 7 are formed by sputtering in an oxidizing atmosphere using the Cu alloy sputtering target of the present invention. Therefore, as described above, the adhesiveness is excellent between the barrier layer 7 and the wire layer 9 and between the barrier layer 7 and the n-type Si semiconductor layer 6. Furthermore, this excellent adhesiveness can be maintained even after a hydrogen plasma treatment performed under conditions including high temperatures and long time periods. In addition, an excellent barrier function can also be obtained.

EXAMPLE

Next, the adhesion strength between the barrier layer and the n-type Si semiconductor layer in the thin film transistor of the present invention will be specifically explained with examples.

In accordance with conventional conditions for film formation, a 250 nm-thick gate electrode layer of pure copper was joined to the surface of a glass substrate having dimensions of 320 mm height×400 mm width×0.7 mm thickness through a 50 nm-thick adhesion layer of metallic Mo. A 300 nm-thick gate electrode layer of silicon nitride, a 150 nm-thick Si semiconductor layer, and a 10 nm-thick n-type Si semiconductor layer were laminated in series on the gate electrode layer.

Through melting preparation, Cu alloy sputtering targets of Invention Examples (hereinafter referred to as 'targets of Invention Example') and Cu-alloy sputtering targets of Comparative Examples (hereinafter referred to as 'targets of Comparative Example') were manufactured. The targets of Invention Example were Cu—Al—Ca alloys having the component compositions shown in Tables 1 and 2, and the targets of Comparative Example were Cu—Al alloys. Here, the contents of inevitable impurities were in a range of 1% or less in all of the targets.

A glass substrate having a laminate manufactured by the above-described process was loaded in a sputtering apparatus, and was subjected to sputtering using each of the targets under conditions where an atmosphere was an oxidizing atmosphere of Ar+oxygen (by volume %, Ar/oxygen=90/10), a pressure of the atmosphere was 0.4 Pa, and a temperature at which the substrate was heated was 100° C.; and thereby, a 50 nm-thick barrier layer was formed.

Then, a 250 nm-thick wire layer of pure copper was formed.

Thereby, specimens of the thin film transistors of Invention Examples Nos. 1 to 20 (with Invention Example No. 1 being Reference Example No. 1) and specimens of the thin film transistors of Comparative Examples Nos. 1 to 10 were manufactured, respectively.

Next, a hydrogen plasma treatment was performed on the obtained specimens of the thin film transistors of Invention Examples Nos. 1 to 20 (with Invention Example No. 1 being Reference Example No. 1) and the obtained specimens of the thin film transistors of Comparative Examples Nos. 1 to 10 under the following conditions.

Gas: 100% hydrogen gas

Flow rate of the hydrogen gas: 500 sccm

Pressure of the hydrogen gas: 250 Pa

Treatment temperature: 275° C.

Output: 0.1 W/cm$^2$

Treatment time: 3 minutes

The above-described conditions are the conditions for a hydrogen plasma treatment in compliance with the increase in the screen size and integration of flat panel displays, and the treatment temperature is higher and the treatment time is longer than those in the conditions for the conventional hydrogen plasma treatment.

With regard to the adhesiveness of the barrier layer to the n-type Si semiconductor layer, the variation before and after the hydrogen plasma treatment was confirmed by performing a cross cut adhesion test.

In accordance with JIS-K5400, 11-by-11 grooves (notches) were formed in the surface of the above-mentioned specimen by using a cutter, at an interval selected from 0.5 mm, 1 mm, 1.5 mm, and 2 mm, at a depth reaching the n-type Si semiconductor layer from the surface and at a groove width of 0.1 mm. Thereby, 100 cells (squares) were formed at each of the intervals. A Scotch tape manufactured by 3M was adhered throughout the squares, and then was taken away from the surface at once. The number (number/100) of squares peeled off among the hundred squares in the surface of the specimen was measured. The measurement results are shown in Tables 1 to 3.

TABLE 1

| Type | | Target Type | Components and composition (atomic %) Al | Ca | Cu + impurities | Before hydrogen plasma treatment Number of squares peeled (squares/100) Dimensions of squares | | | | After hydrogen plasma treatment Number of squares peeled (squares/100) Dimensions of squares | | | |
|---|---|---|---|---|---|---|---|---|---|---|---|---|---|
| | | | | | | 0.5 mm☐ | 1 mm☐ | 1.5 mm☐ | 2 mm☐ | 0.5 mm☐ | 1 mm☐ | 1.5 mm☐ | 2 mm☐ |
| Specimens of thin film transistors of Invention Examples including Reference Example No. 1 | 1 | Targets of Invention Examples | 1.03 | 0.60 | balance | 0 | 0 | 0 | 0 | 5 | 0 | 0 | 0 |
| | 2 | | 2.06 | 0.63 | balance | 0 | 0 | 0 | 0 | 0 | 0 | 0 | 0 |
| | 3 | | 3.01 | 0.57 | balance | 0 | 0 | 0 | 0 | 0 | 0 | 0 | 0 |
| | 4 | | 4.03 | 0.61 | balance | 0 | 0 | 0 | 0 | 0 | 0 | 0 | 0 |
| | 5 | | 4.92 | 0.59 | balance | 0 | 0 | 0 | 0 | 0 | 0 | 0 | 0 |
| | 6 | | 6.04 | 0.61 | balance | 0 | 0 | 0 | 0 | 0 | 0 | 0 | 0 |
| | 7 | | 6.98 | 0.64 | balance | 0 | 0 | 0 | 0 | 0 | 0 | 0 | 0 |
| | 8 | | 7.98 | 0.58 | balance | 0 | 0 | 0 | 0 | 0 | 0 | 0 | 0 |
| | 9 | | 9.07 | 0.60 | balance | 0 | 0 | 0 | 0 | 0 | 0 | 0 | 0 |
| | 10 | | 9.95 | 0.62 | balance | 0 | 0 | 0 | 0 | 0 | 0 | 0 | 0 |

TABLE 2

| Type | | Target Type | Components and composition (atomic %) Al | Ca | Cu + impurities | Before hydrogen plasma treatment Number of squares peeled (squares/100) Dimensions of squares | | | | After hydrogen plasma treatment Number of squares peeled (squares/100) Dimensions of squares | | | |
|---|---|---|---|---|---|---|---|---|---|---|---|---|---|
| | | | | | | 0.5 mm☐ | 1 mm☐ | 1.5 mm☐ | 2 mm☐ | 0.5 mm☐ | 1 mm☐ | 1.5 mm☐ | 2 mm☐ |
| Specimens of thin film transistors of Invention Examples | 11 | Targets of Invention Examples | 5.03 | 0.12 | balance | 0 | 0 | 0 | 0 | 5 | 0 | 0 | 0 |
| | 12 | | 4.86 | 0.21 | balance | 0 | 0 | 0 | 0 | 3 | 0 | 0 | 0 |
| | 13 | | 5.11 | 0.43 | balance | 0 | 0 | 0 | 0 | 2 | 0 | 0 | 0 |
| | 14 | | 5.23 | 0.59 | balance | 0 | 0 | 0 | 0 | 0 | 0 | 0 | 0 |
| | 15 | | 5.52 | 0.78 | balance | 0 | 0 | 0 | 0 | 0 | 0 | 0 | 0 |
| | 16 | | 4.97 | 0.97 | balance | 0 | 0 | 0 | 0 | 0 | 0 | 0 | 0 |
| | 17 | | 4.78 | 1.22 | balance | 0 | 0 | 0 | 0 | 0 | 0 | 0 | 0 |
| | 18 | | 4.90 | 1.46 | balance | 0 | 0 | 0 | 0 | 0 | 0 | 0 | 0 |
| | 19 | | 5.34 | 1.73 | balance | 0 | 0 | 0 | 0 | 0 | 0 | 0 | 0 |
| | 20 | | 5.45 | 1.95 | balance | 0 | 0 | 0 | 0 | 0 | 0 | 0 | 0 |

TABLE 3

| Type | | Target Type | Components and composition (atomic %) Al | Ca | Cu + impurities | Before hydrogen plasma treatment Number of measures peeled (measures/100) Dimensions of measures | | | | After hydrogen plasma treatment Number of measures peeled (measures/100) Dimensions of measures | | | |
|---|---|---|---|---|---|---|---|---|---|---|---|---|---|
| | | | | | | 0.5 mm☐ | 1 mm☐ | 1.5 mm☐ | 2 mm☐ | 0.5 mm☐ | 1 mm☐ | 1.5 mm☐ | 2 mm☐ |
| Specimens of thin film transistors of Comparative Examples | 1 | Targets of Comparative Examples | 1.01 | — | balance | 0 | 0 | 0 | 0 | 100 | 100 | 100 | 71 |
| | 2 | | 1.96 | — | balance | 0 | 0 | 0 | 0 | 100 | 100 | 100 | 52 |
| | 3 | | 3.03 | — | balance | 0 | 0 | 0 | 0 | 100 | 100 | 72 | 30 |
| | 4 | | 3.83 | — | balance | 0 | 0 | 0 | 0 | 100 | 100 | 49 | 18 |
| | 5 | | 5.02 | — | balance | 0 | 0 | 0 | 0 | 100 | 100 | 31 | 15 |
| | 6 | | 5.99 | — | balance | 0 | 0 | 0 | 0 | 100 | 83 | 28 | 10 |
| | 7 | | 7.08 | — | balance | 0 | 0 | 0 | 0 | 100 | 51 | 15 | 8 |
| | 8 | | 8.06 | — | balance | 0 | 0 | 0 | 0 | 100 | 31 | 14 | 6 |
| | 9 | | 9.10 | — | balance | 0 | 0 | 0 | 0 | 91 | 28 | 10 | 5 |
| | 10 | | 9.97 | — | balance | 0 | 0 | 0 | 0 | 56 | 18 | 8 | 2 |

The specimen of the thin film transistor of Invention Example had the barrier layer as a constituting layer which was formed by sputtering in an oxidizing atmosphere using each of the targets of Invention Examples. From the results shown in Tables 1 to 3, it was found that extremely high adhesion strength (adhesiveness) was secured between the barrier layer and the n-type Si semiconductor layer in all of the specimens of the thin film transistors of Invention Examples Nos. 1 to 20 in spite of the hydrogen plasma treatment under the conditions including a relatively high treatment temperature and a relatively long treatment time.

In contrast, the specimen of the thin film transistor of Comparative Example had the bather layer as a constituting layer which was formed under the same sputtering conditions as Invention Example using each of the targets of Comparative Examples Nos. 1 to 10 having the component compositions that correspond to the conventional Cu alloy sputtering target. It was found that adhesion strength (adhesiveness) was low between the barrier layer and the n-type Si semiconductor layer in all of the specimens of the thin film transistors of Comparative Examples Nos. 1 to 10 after the hydrogen plasma treatment under the conditions including a higher treatment temperature and a longer treatment time in comparison to the ordinary conditions.

As described above, the thin film transistor of the present invention can have satisfactory properties to meet the requirements in compliance with the increase in the screen size and integration of flat panel displays.

Industrial Applicability

In accordance with the present invention, it is possible to realize a thin film transistor which includes barrier layers having excellent adhesiveness between the barrier layer and a wire layer and between the barrier layer and an n-type Si semiconductor layer and having an excellent barrier function. This excellent adhesiveness can be maintained even after a hydrogen plasma treatment performed under conditions including high temperatures and long processing periods. Therefore, the present invention can be favorably applied as a thin film transistor that has satisfactory properties to meet the requirements in compliance with the increase in the screen size and integration of flat panel displays.

Brief Description of Reference Signs

1: GLASS SUBSTRATE, 2: ADHESION LAYER, 3: GATE ELECTRODE LAYER, 4: GATE INSULATING LAYER, 5: Si SEMICONDUCTOR LAYER, 6: n-TYPE Si SEMICONDUCTOR LAYER, 7: BARRIER LAYER, 8: ISOLATION TRENCH, 9: WIRE LAYER, 9a: DRAIN ELECTRODE LAYER, 9b: SOURCE ELECTRODE LAYER

The invention claimed is:

1. A Cu alloy sputtering target used for sputter film formation of a barrier layer,
   wherein the Cu alloy sputtering target is used to form a barrier layer constituting a thin film transistor by sputtering under an oxidizing atmosphere, and
   the Cu alloy sputtering target is composed of a Cu alloy which comprises, in terms of atomic percent:
   Al: 1% to 10%; and
   Ca: 0.1% to 2%,
   with the balance being Cu and 1% or less of inevitable impurities,
   wherein a ratio of a content of Al in terms of atomic percent to a content of Ca in terms of atomic percent is in a range of 2.79 or more.

* * * * *